United States Patent
Joo et al.

(10) Patent No.: US 7,981,786 B2
(45) Date of Patent: Jul. 19, 2011

(54) METHOD OF FABRICATING NON-VOLATILE MEMORY DEVICE HAVING CHARGE TRAPPING LAYER

(75) Inventors: Moon Sig Joo, Icheon-si (KR); Seung Ho Pyi, Yongin-si (KR); Ki Seon Park, Yongin-si (KR); Heung Jae Cho, Icheon-si (KR); Yong Top Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 235 days.

(21) Appl. No.: 11/966,231

(22) Filed: Dec. 28, 2007

(65) Prior Publication Data

US 2009/0004802 A1    Jan. 1, 2009

(30) Foreign Application Priority Data

Jun. 29, 2007  (KR) .................... 10-2007-0065846

(51) Int. Cl.
*H01L 21/3205* (2006.01)
*H01L 21/4763* (2006.01)
*H01L 21/302* (2006.01)
*H01L 21/461* (2006.01)

(52) U.S. Cl. ........ 438/594; 438/592; 438/593; 438/742; 438/942; 438/586; 257/E21.192; 257/E21.21; 257/E21.645; 257/E21.646

(58) Field of Classification Search .................... 438/594
See application file for complete search history.

(56) References Cited

U.S. PATENT DOCUMENTS

| | | | | |
|---|---|---|---|---|
| 5,545,578 A * | 8/1996 | Park et al. | ...................... | 438/303 |
| 5,796,151 A * | 8/1998 | Hsu et al. | ...................... | 257/410 |
| 6,033,980 A * | 3/2000 | Liou et al. | ..................... | 438/624 |
| 6,063,698 A * | 5/2000 | Tseng et al. | ................... | 438/585 |
| 6,075,274 A * | 6/2000 | Wu et al. | ....................... | 257/413 |
| 6,194,294 B1 * | 2/2001 | Lee | ................................ | 438/585 |
| 6,218,331 B1 * | 4/2001 | DiMaio et al. | ................ | 502/109 |
| 6,417,084 B1 * | 7/2002 | Singh et al. | .................... | 438/585 |
| 6,514,842 B1 * | 2/2003 | Prall et al. | ..................... | 438/593 |

(Continued)

FOREIGN PATENT DOCUMENTS

KR   10-2004-0003922    1/2004

(Continued)

*Primary Examiner* — Charles D Garber
*Assistant Examiner* — Pape Sene
(74) *Attorney, Agent, or Firm* — Marshall, Gerstein & Borun LLP (57) ABSTRACT

A method of fabricating a non-volatile memory device having a charge trapping layer includes forming a tunneling layer, a charge trapping layer, a blocking layer and a control gate electrode layer over a substrate, forming a mask layer pattern on the control gate electrode layer, performing an etching process using the mask layer pattern as an etching mask to remove an exposed portion of the control gate electrode layer, wherein the etching process is performed as excessive etching to remove the charge trapping layer by a specified thickness, forming an insulating layer for blocking charges from moving on the control gate electrode layer and the mask layer pattern, performing anisotropic etching on the insulating layer to form an insulating layer pattern on a sidewall of the control gate electrode layer and a partial upper sidewall of the blocking layer, and performing an etching process on the blocking layer exposed by the anisotropic etching, wherein the etching process is performed as excessive etching to remove the charge trapping layer by a specified thickness.

18 Claims, 8 Drawing Sheets

U.S. PATENT DOCUMENTS

| | | | |
|---|---|---|---|
| 6,828,242 B2 * | 12/2004 | Kujirai et al. | 438/706 |
| 6,992,010 B2 * | 1/2006 | Chou et al. | 438/694 |
| 7,371,669 B2 * | 5/2008 | Youn et al. | 438/585 |
| 2003/0040183 A1 * | 2/2003 | Kujirai et al. | 438/694 |
| 2004/0229437 A1 * | 11/2004 | Tseng et al. | 438/265 |
| 2006/0043457 A1 * | 3/2006 | Baik | 257/314 |
| 2006/0043466 A1 * | 3/2006 | Manning et al. | 257/316 |
| 2006/0084255 A1 * | 4/2006 | Oyu et al. | 438/592 |
| 2006/0170032 A1 * | 8/2006 | Bhattacharyya | 257/317 |
| 2006/0205163 A1 * | 9/2006 | Pittikoun et al. | 438/287 |
| 2008/0032470 A1 * | 2/2008 | Lee et al. | 438/238 |

FOREIGN PATENT DOCUMENTS

| | | |
|---|---|---|
| KR | 10-2006-0000793 | 1/2006 |
| KR | 10-2006-0023489 | 3/2006 |
| KR | 10-2006-0035551 | 4/2006 |

* cited by examiner

METHOD OF FABRICATING NON-VOLATILE MEMORY DEVICE HAVING CHARGE TRAPPING LAYER

CROSS-REFERENCES TO RELATED APPLICATIONS

The priority benefit of Korean patent application number 10-2007-0065846, filed on Jun. 29, 2007, is hereby claimed and the disclosure thereof is incorporated herein by reference in its entirety.

BACKGROUND OF THE INVENTION

The present invention relates to a method of fabricating a non-volatile memory device, and more particularly to a method of fabricating a non-volatile memory device having a charge trapping layer.

Semiconductor memory devices used for storing data may be classified into volatile and non-volatile semiconductor memory devices. As power supply is stopped, volatile memory devices lose stored data, whereas non-volatile memory devices retain stored data. Accordingly, non-volatile memory devices are widely used when power cannot be continuously supplied or the use of low power is required as in portable telephone systems, memory cards for storing music and/or image data, and other appliances.

Cell transistors used in the non-volatile memory devices typically have a floating gate structure. The floating gate structure includes a gate insulating layer, a floating gate electrode, an insulating layer between gates, and a control gate electrode, which are sequentially stacked on a channel region of the cell transistor. However, severe interference phenomena are generated in the floating gate structure according to an increase in integration density. Accordingly, the floating gate structure poses a limit in increasing the integration density of the devices. Thus, recently, there is an increasing interest in a non-volatile memory device having a charge trapping layer in which interference phenomena are less generated as integration density increases.

The non-volatile memory device having a charge trapping layer generally has a structure in which a substrate having a channel region, a tunneling layer, a charge trapping layer, a blocking layer and a control gate electrode are sequentially stacked. As described above, the non-volatile memory device having a charge trapping layer can realize high integration density compared to the floating gate structure, but it has a drawback in that an erase operation speed is relatively low. The magnitude of a voltage applied to the control gate electrode in the erase operation should be increased to overcome the drawback. However, when a high voltage is applied to the control gate electrode in the erase operation, there may be a problem such as a backward tunneling phenomenon in which electrons in the control gate electrode pass through the blocking layer and enter into the charge trapping layer. Accordingly, a so-called Metal-Alumina-Nitride-Oxide-Silicon (MANOS) structure in which a high-k insulating layer such as an aluminum oxide ($Al_2O_3$) layer is used as a blocking layer and a metal gate having a sufficiently large work function is used as a control gate electrode has been recently proposed to suppress generation of the backward tunneling phenomenon.

In order to form a MANOS device, first, a tunneling layer, a charge trapping layer, a blocking layer and a control gate electrode layer are sequentially stacked on a substrate. The tunneling layer may be formed of an oxide layer. The charge trapping layer may be formed of a nitride layer. The blocking layer may be formed of an alumina layer. The control gate electrode layer may be formed of a metal layer. Then, an etching process using a hard mask layer pattern is performed to etch an exposed portion of the control gate electrode layer and also etch the exposed blocking layer. In this case, generally, excessive etching is performed to sufficiently etch the blocking layer. Accordingly, the charge trapping layer is also etched by a specified thickness through the excessive etching. Then, after the exposed charge trapping layer and tunneling layer are etched, the hard mask layer pattern is removed.

However, while the excessive etching is performed on the blocking layer, etching damage caused by ion bombardment may be generated on exposed sidewalls of the blocking layer, the charge trapping layer and an exposed surface of the charge trapping layer. Furthermore, a conductive polymer containing etching by-products such as aluminum (Al) or nitrogen (N) may be attached to the exposed sidewall of the blocking layer. In this case, undesirable trap sites may be formed at a portion with the etching damage. When electrons or holes are trapped in the trap sites, leakage current may be easily generated. Furthermore, the conductive polymer attached to the exposed sidewall of the blocking layer may form a charge moving path, and charges in the charge trapping layer may move to the control gate electrode through the charge moving path. Accordingly, threshold voltage distribution characteristics and/or retention characteristics of the device may be degraded.

BRIEF SUMMARY OF THE INVENTION

An aspect of the present invention is to provide a method of fabricating a non-volatile memory device having a charge trapping layer capable of preventing deterioration of device characteristics due to etching damage generated by etching in a fabricating process and capable of suppressing generation of leakage current by isolating a charge moving path which is abnormally formed by a conductive polymer.

In accordance with an aspect of the invention, there is provided a method of fabricating a non-volatile memory device having a charge trapping layer comprising: sequentially forming a tunneling layer, a charge trapping layer, a blocking layer and a control gate electrode layer on a substrate; performing a first etching process using a mask layer pattern as an etching mask to remove the control gate electrode layer exposed by the mask layer pattern and also remove the blocking layer by a specified thickness; forming an insulating layer on sidewalls of the control gate electrode layer and the blocking layer exposed by the first etching process; and performing a second etching process using the mask layer pattern and the insulating layer as an etching mask to remove an exposed portion of the blocking layer.

In accordance with another aspect of the invention, there is provided a method of fabricating a non-volatile memory device having a charge trapping layer comprising: sequentially forming a tunneling layer, a charge trapping layer, a blocking layer and a control gate electrode layer on a substrate; performing a first etching process using a mask layer pattern as an etching mask to remove the control gate electrode layer exposed by the mask layer pattern and also remove the blocking layer by a specified thickness; forming an insulating layer on sidewalls of the control gate electrode layer and the blocking layer exposed by the first etching process; and performing a second etching process using the mask layer pattern and the insulating layer as an etching mask to remove an exposed portion of the blocking layer, wherein the second etching process is performed as excessive etching to remove the charge trapping layer by a specified thickness; and performing a process for curing etching damage to form an etching damage cured layer on a sidewall of the blocking layer and an exposed portion of the charge trapping layer which are exposed by the second etching process.

In accordance with yet another aspect of the invention, there is provided a method of fabricating a non-volatile memory device having a charge trapping layer comprising: sequentially forming a tunneling layer, a charge trapping layer, a blocking layer and a control gate electrode layer on a substrate; performing a first etching process using a mask layer pattern as an etching mask to remove exposed portions of the control gate electrode layer and the blocking layer and also remove the charge trapping layer by a specified thickness; and forming an insulating layer on sidewalls of the control gate electrode layer, the blocking layer and the charge trapping layer exposed by the first etching process.

In accordance with yet another aspect of the invention, there is provided a method of fabricating a non-volatile memory device having a charge trapping layer comprising: sequentially forming a tunneling layer, a charge trapping layer, a blocking layer and a control gate electrode layer on a substrate; performing a first etching process using a mask layer pattern as an etching mask to remove exposed portions of the control gate electrode layer, the blocking layer and the charge trapping layer and also remove the tunneling layer by a specified thickness; and forming an insulating layer on sidewalls of the control gate electrode layer, the blocking layer, the charge trapping layer and the tunneling layer exposed by the first etching process.

In order to block a charge leakage path formed by a conductive polymer generated in etching, the method according to the present invention can include forming a blocking layer on an upper sidewall of the charge trapping layer and a sidewall of the control gate electrode before the etching is performed. Further, the method according to the present invention can include performing a process for curing etching damage after the etching is performed in order to suppress formation of undesirable trap sites by curing the etching damage.

DETAILED DESCRIPTION OF THE INVENTION

Figure 1:
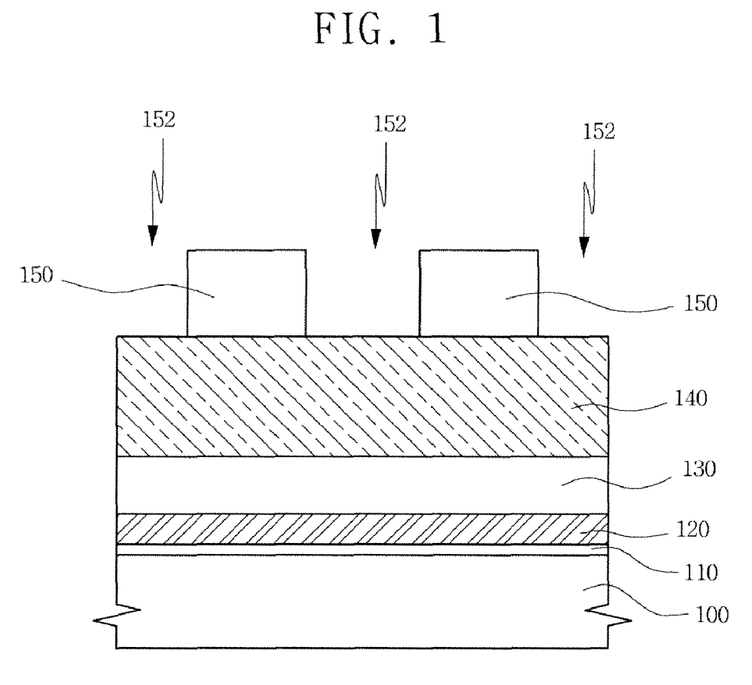
FIGS. 1 to 6 show cross-sectional views for explaining a method of fabricating a non-volatile memory device according to an embodiment of the present invention.

FIGS. 1 to 6 show cross-sectional views for explaining a method of fabricating a non-volatile memory device according to an embodiment of the present invention. Referring to FIG. 1, a tunneling layer 110 is formed on a substrate 100. Although the substrate 100 is typically a silicon substrate, the substrate 100 may be another type of substrate such as a silicon-on-insulator (SOI) substrate according to circumstances. The tunneling layer 110 may be formed of an oxide layer having a thickness in a range of about 20 Å-60 Å. Then, a charge trapping layer 120 is formed on the tunneling layer 110. The charge trapping layer 120 may be formed of a silicon nitride layer having a thickness in a range of about 20 Å-100 Å. In another embodiment, the charge trapping layer 120 may include at least one of stoichiometric silicon nitride and silicon-rich silicon nitride layers. When the charge trapping layer 120 includes a silicon-rich silicon nitride layer, a ratio of silicon (Si) to nitrogen (N) preferably is set to be in a range of about 0.85:1 to 10:1. The ratio of silicon (Si) to nitrogen (N) may be controlled properly by controlling a supplying ratio of silicon source gas to nitrogen source gas.

Then, a blocking layer 130 is formed on the charge trapping layer 120. The blocking layer 130 may be formed of a high-k insulating layer having a dielectric constant preferably greater than or equal to 8. The high-k insulating layer may include an alumina ($Al_2O_3$) layer having a thickness in a range of about 50 Å-300 Å. In another embodiment, the high-k insulating layer may include a hafnium oxide ($HfO_2$) layer, a hafnium aluminum oxide (HfAlO) layer or a zirconium oxide ($ZrO_2$) layer. In yet another embodiment, the blocking layer may be formed of an oxide layer by a chemical vapor deposition (CVD) method. After the blocking layer 130 is formed of a high-k insulating layer, the blocking layer 130 may be densified by rapid thermal treatment.

Then, a control gate electrode 140 is formed on the blocking layer 130. The control gate electrode 140 may be formed of a metal layer having a work function greater than or equal to about 4.5 eV, for example, a titanium nitride (TiN) layer, a tantalum nitride (TaN) layer, a hafnium nitride (HfN) layer, or a tungsten nitride (WN) layer. In one embodiment, a metal layer (not shown) serving as a word line may be formed on the control gate electrode 140. The metal layer may be formed to have a stacked structure of a tungsten (W) layer over a tungsten silicide (WSi) layer over a polysilicon layer. After the control gate electrode 140 is formed, a mask layer pattern 150 is formed on the control gate electrode 140. The mask layer pattern 150 has openings 152 which expose a portion of the control gate electrode 140. The mask layer pattern 150 may be formed of a nitride layer or a double layer of an oxynitride layer and an oxide layer.

Figure 2:
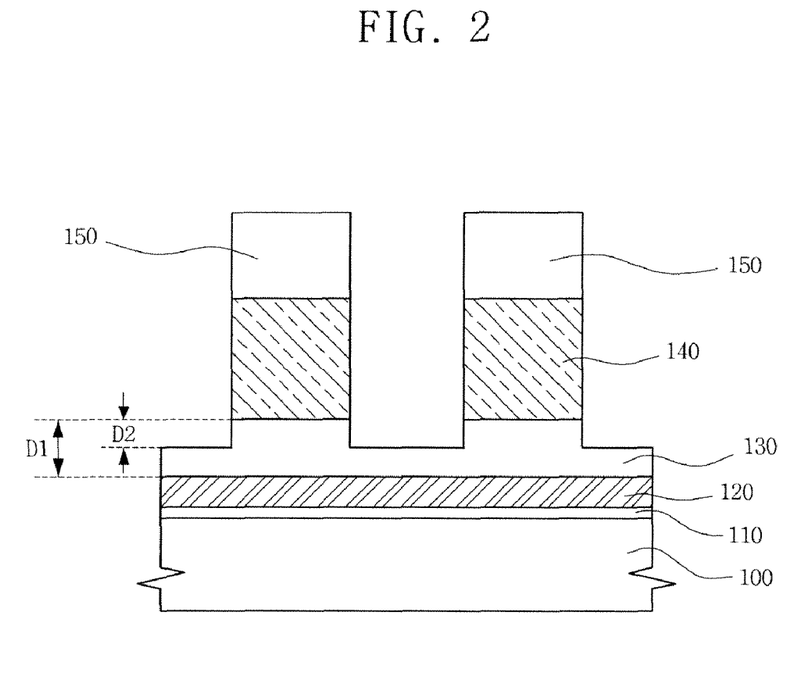

Referring to FIG. 2, the exposed portion of the control gate electrode 140 is removed by a first etching process using the mask layer pattern 150 as an etching mask. The first etching process preferably is performed using a dry etching method, for example, a reactive ion etching (RIE) method. In this case, an etching gas used in the first etching process may vary according to the type of material forming the control gate electrode 140. For example, when the control gate electrode 140 is formed of a titanium nitride (TiN) layer, a $BCl_3$ gas, a $Cl_2$ gas, or a mixture of a $BCl_3$ gas and a $Cl_2$ gas is used as an etching gas. The first etching process is performed to remove the exposed blocking layer by a specified thickness after removing the exposed portion of the control gate electrode 140. The blocking layer 130 is removed by a thickness D2 which preferably is in a range of about 20% to 50% of a total thickness D1 of the blocking layer 130. For example, when the blocking layer 130 has a total thickness D1 of 50 Å, the removed thickness D2 of the blocking layer 130 preferably is in a range of about 10 Å to 25 Å. When the blocking layer 130 has a total thickness D1 of 300 Å, the removed thickness D2 of the blocking layer 130 preferably is in a range of about 60 Å to 150 Å. In any case, the blocking layer 130 preferably is removed by at least a thickness of 10 Å. A sidewall of the control gate electrode 140 is totally exposed and an upper sidewall of the blocking layer 130 generally corresponding to the specified thickness is exposed through the above etching process.

Figure 3:
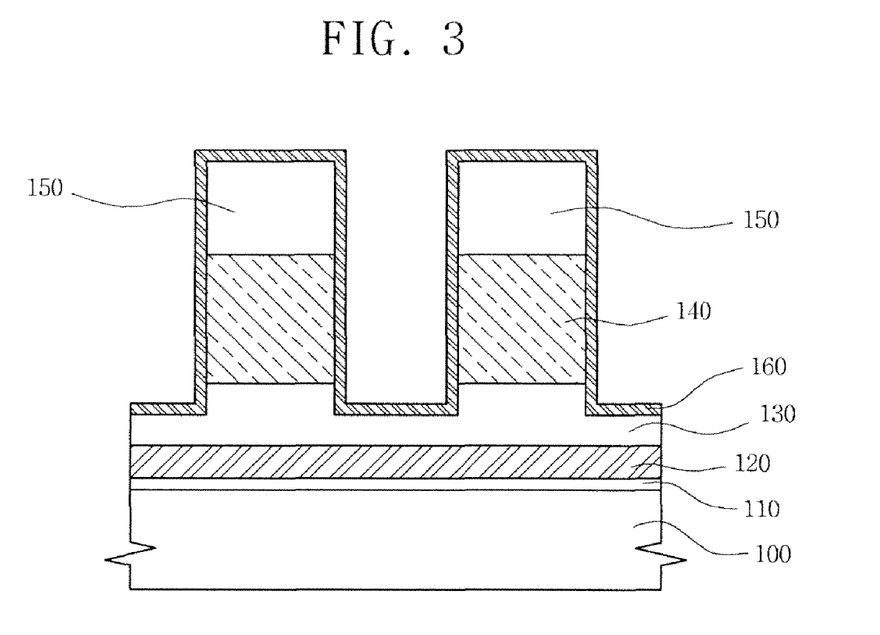

Referring to FIG. 3, an insulating layer 160 is formed on the entire surface of the resultant structure shown in FIG. 2. The insulating layer 160 is formed on the entire exposed surface of the blocking layer 130, the control gate electrode 140 and the mask layer pattern 150. For example, the insulating layer 160 is formed of a nitride layer having a thickness in a range of about 20 Å to 100 Å, to block a passage in which electric charges move between the charge trapping layer 120 and the control gate electrode 140. As other examples, the insulating layer 160 may include an oxide layer formed by a low pressure chemical vapor deposition (LPCVD) method, an oxide layer formed by an atomic layer deposition (ALD) method or a plasma enhanced chemical vapor deposition (PECVD) method, or an oxynitride layer. As yet another example, the insulating layer 160 may be formed of an alumina ($Al_2O_3$) layer or a high-k dielectric layer.

Figure 4:
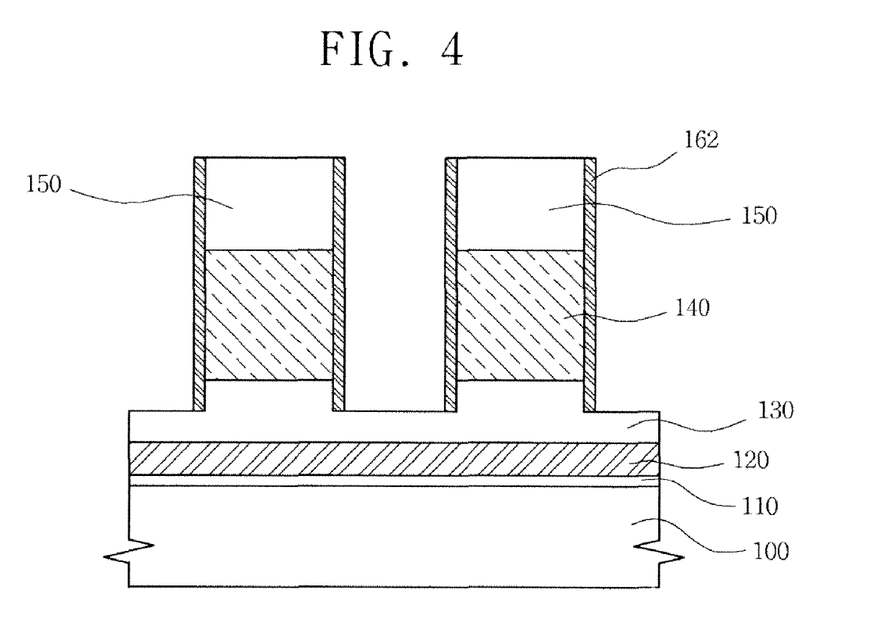

Referring to FIG. 4, anisotropic etching is performed on the insulating layer 160. The anisotropic etching may be performed using an etch back method. According to circumstances, the anisotropic etching may be performed using a dry etching method. In any method, the anisotropic etching is performed to remove the insulating layer 160 in contact with an upper portion of the mask layer pattern 150 and an upper portion of the blocking layer 130. Through the anisotropic etching, an upper surface of the mask layer pattern 150 and a partial upper surface of the blocking layer 130 are exposed, thereby forming a blocking layer 162 which is formed of the insulating layer remaining on a partial upper sidewall of the blocking layer 130, a sidewall of the control gate electrode 140 and a sidewall of the mask layer pattern 150.

Figure 5:
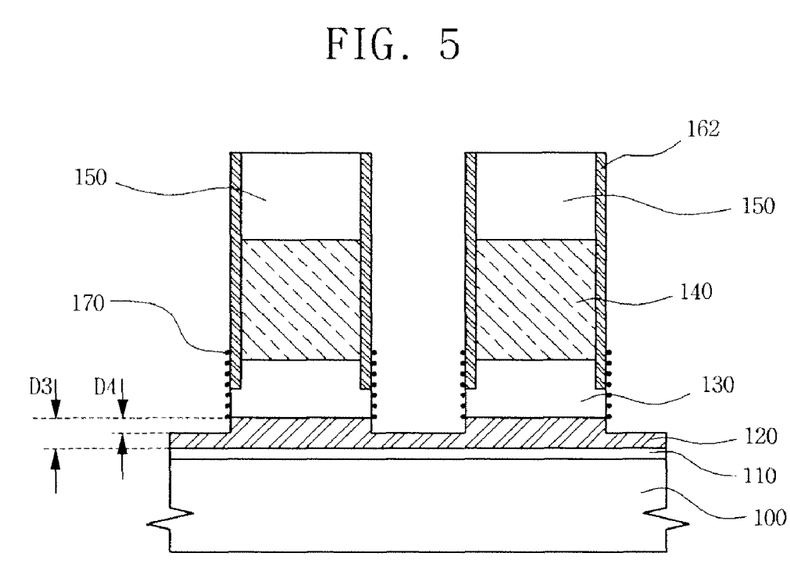

Referring to FIG. 5, a second etching process is performed on the exposed blocking layer 130 to remove an exposed portion of the blocking layer 130. The second etching process preferably is also performed using a dry etching method such as a reactive ion etching (RIE) method. In this case, a reaction gas used in the second etching process may vary according to the type of material forming the blocking layer 130. For example, when the blocking layer 130 is formed of an alumina ($Al_2O_3$) layer, a $BCl_3$ gas and a $CH_4$ gas may be used as an etching gas. The second etching process preferably is performed such that the charge trapping layer 120 exposed by removing the exposed portion of the blocking layer 130 is also removed by a specified thickness. According to circumstances, an exposed portion of the charge trapping layer 120 may be totally removed to expose an upper surface of the tunneling layer 110 below the removed portion. During the second etching process, a conductive polymer 170 may be formed on a sidewall of the blocking layer 130. However, an electrical barrier is formed between the charge trapping layer 120 and the control gate electrode 140 by the blocking layer 162. Accordingly, although a charge moving path is formed at a sidewall of the blocking layer 130 by the conductive polymer 170, the blocking layer 162 prevents charges from moving from the charge trapping layer 120 to the control gate electrode 140. A thickness D4 of the charge trapping layer 120 which is etched by the second etching process is at least 50% of a total thickness D3 of the charge trapping layer 120. For example, when the charge trapping layer 120 has a total thickness D3 of 20 Å, the removed thickness D4 of the charge trapping layer 120 preferably is at least 10 Å. When the charge trapping layer 120 has the total thickness D3 of 100 Å, the removed thickness D4 of the charge trapping layer 120 is at least 50 Å.

Figure 6:
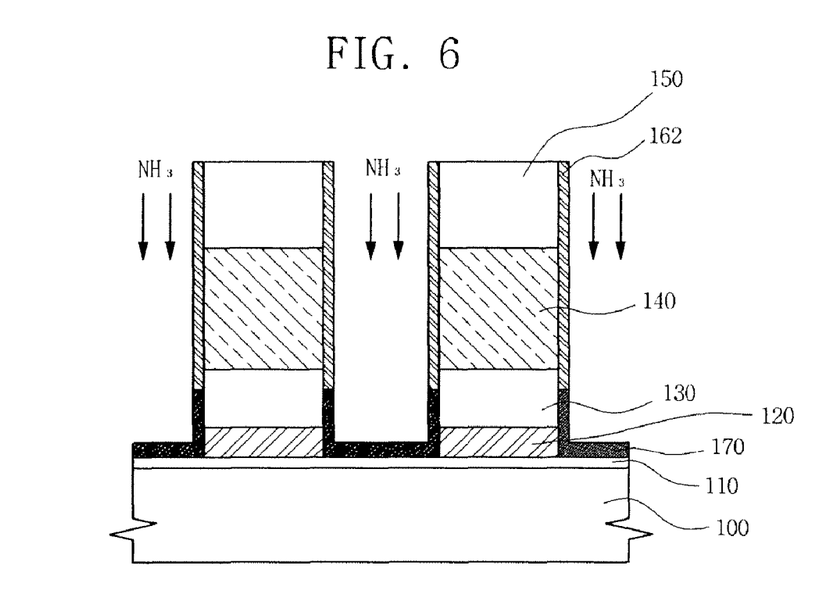

Referring to FIG. 6, a process for curing etching damage is performed on exposed sidewalls of the blocking layer 130 and the charge trapping layer 120 and an exposed upper surface of the charge trapping layer 120. The process for curing etching damage may be performed by $NH_3$ treatment as represented by arrows in FIG. 6. In one embodiment, the $NH_3$ treatment may be performed by rapid thermal treatment (RTP). In this case, an $NH_3$ atmosphere preferably is formed at a temperature in a range of about 700° C. to 1000° C. in a chamber for the rapid thermal treatment. In another embodiment, the $NH_3$ treatment may be performed by heat treatment in a furnace. In this case, the furnace preferably is maintained at a temperature in a range of about 700° C. to 1000° C. In yet another embodiment, the $NH_3$ treatment may be performed by a plasma method. In this case, a $N_2$ gas preferably is supplied into a plasma chamber and excited to a plasma state. Then, nitrogen in a plasma state is introduced to a substrate. After the $NH_3$ treatment is performed, the rapid thermal treatment or the heat treatment in a furnace may be performed to remove hydrogen. According to circumstances, the process for curing etching damage may be performed in a $N_2$ atmosphere, an $O_2$ atmosphere, or a selective oxidation atmosphere instead of the $NH_3$ atmosphere. Nitrogen is injected into the exposed sidewalls of the blocking layer 130 and the charge trapping layer 120 and the exposed surface of the charge trapping layer 120 by the process for curing etching damage, thereby forming an etching damage cured layer 170 in which trap sites undesirably formed by the etching damage are removed. When the blocking layer 130 is formed of alumina, the etching damage cured layer 170 formed on the side surface of the blocking layer 130 is an AlON layer.

FIGS. 7 to 10 show cross-sectional views for explaining a method of fabricating a non-volatile memory device according to another embodiment of the present invention. The same reference numerals in FIGS. 7 to 10 and FIGS. 1 to 6 represent the same components.

Figure 7:
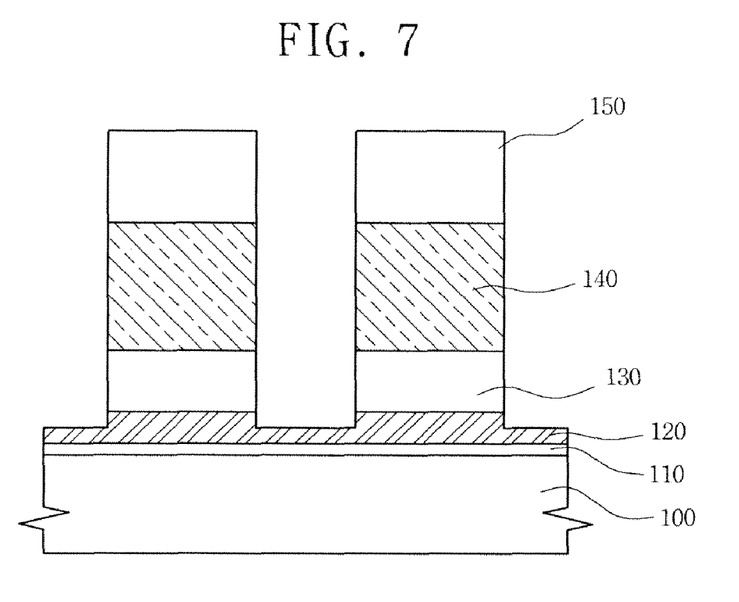
FIGS. 7 to 10 show cross-sectional views for explaining a method of fabricating a non-volatile memory device according to another embodiment of the present invention.
Figure 8:
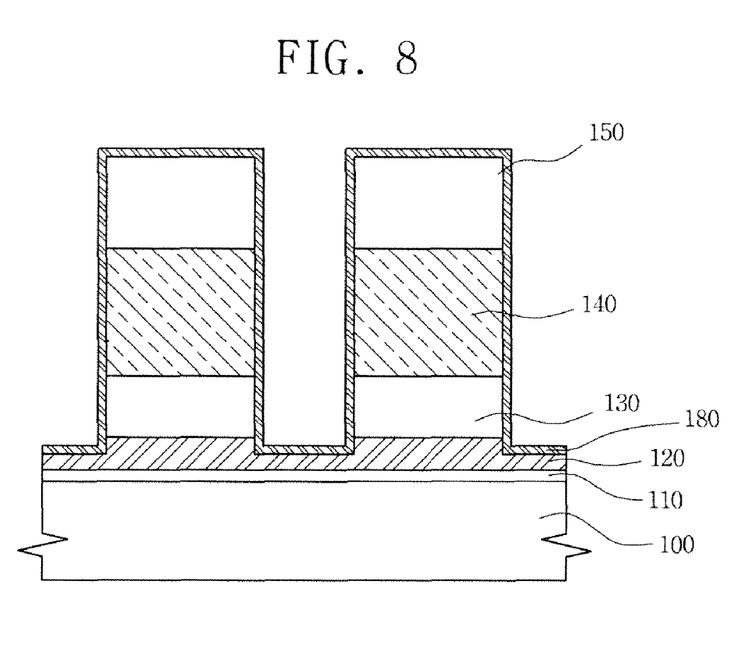

First, as explained referring to FIG. 1, a tunneling layer 110, a charge trapping layer 120, a blocking layer 130, a control gate electrode 140 and a mask layer pattern 150 are formed on a substrate 100. Then, an etching process is performed using the mask layer pattern 150 as an etching mask. The etching process is performed until the charge trapping layer 120 is removed by a specified thickness as shown in FIG. 7. Then, as shown in FIG. 8, an insulating layer 180 for forming a blocking layer is formed on the entire surface of the resultant structure shown in FIG. 7. The insulating layer 180 is formed on the entire exposed surface of the charge trapping layer 120, the blocking layer 130, the control gate electrode 140 and the mask pattern 150. For example, the insulating layer 180 preferably is formed of a nitride layer preferably having a thickness in a range of about 20 Å to 100 Å to block a passage in which electric charges move between the charge trapping layer 120 and the control gate electrode 140. As another example, the insulating layer 180 may include an oxide layer formed by a low pressure chemical vapor deposition (LPCVD) method, an oxide layer formed by a plasma enhanced chemical vapor deposition (PECVD) method, or an oxynitride layer. As yet another example, the insulating layer 180 may be formed of an alumina ($Al_2O_3$) layer or a high-k dielectric layer.

Figure 9:
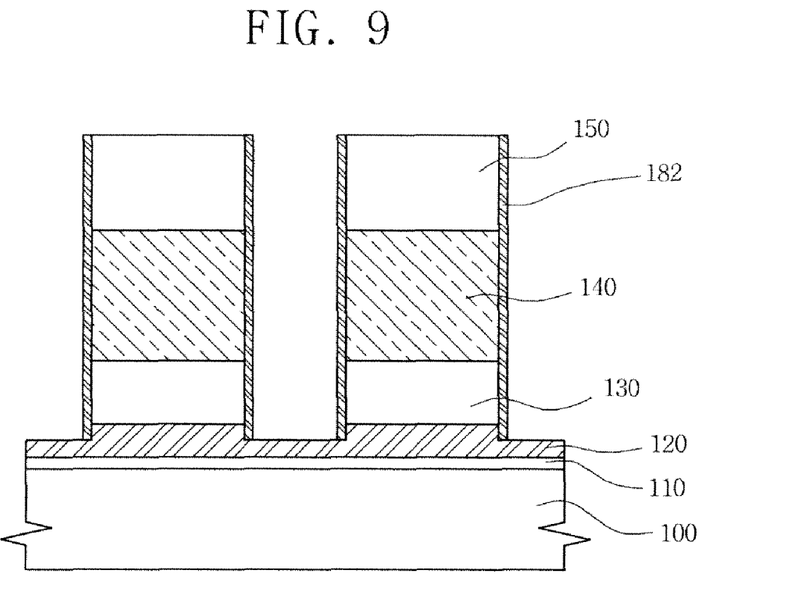
Figure 10:
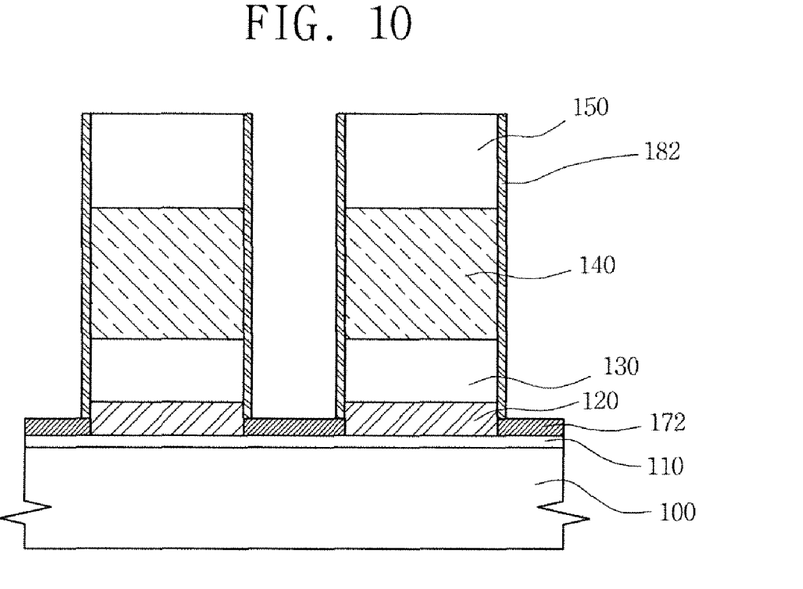

Then, as shown in FIG. 9, anisotropic etching is performed on the insulating layer 180. The anisotropic etching is performed to remove the insulating layer 180 in contact with an upper portion of the mask layer pattern 150 and an upper portion of the charge trapping layer 120. Through the anisotropic etching, an upper surface of the mask pattern 150 and a partial upper surface of the charge trapping layer 120 are exposed, thereby forming a blocking layer 182 which is formed of the insulating layer remaining on a partial upper sidewall of the charge trapping layer 120, a sidewall of the blocking layer 130, a sidewall of the control gate electrode 140 and a sidewall of the mask layer pattern 150. Then, as shown in FIG. 10, a process for curing etching damage is performed on an exposed surface of the charge trapping layer 120. Since the process for curing etching damage is performed as described with reference to FIG. 6, the description thereof is omitted in this embodiment. Nitrogen is injected into the exposed surface of the charge trapping layer 120 by the process for curing etching damage, thereby forming an etching damage cured layer 172 in which trap sites undesirably formed by the etching damage are removed.

Figure 11:
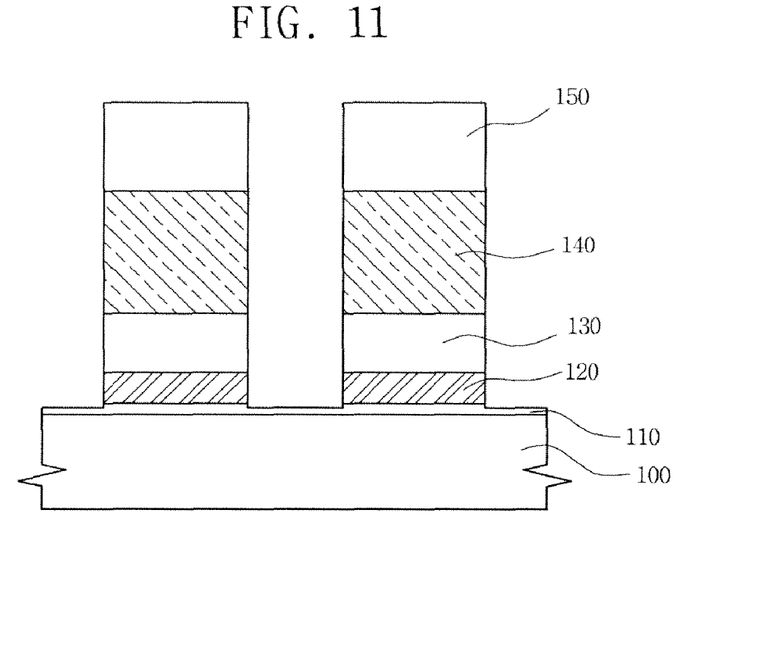
FIGS. 11 and 12 show cross-sectional views for explaining a method of fabricating a non-volatile memory device according to yet another embodiment of the present invention.
Figure 12:
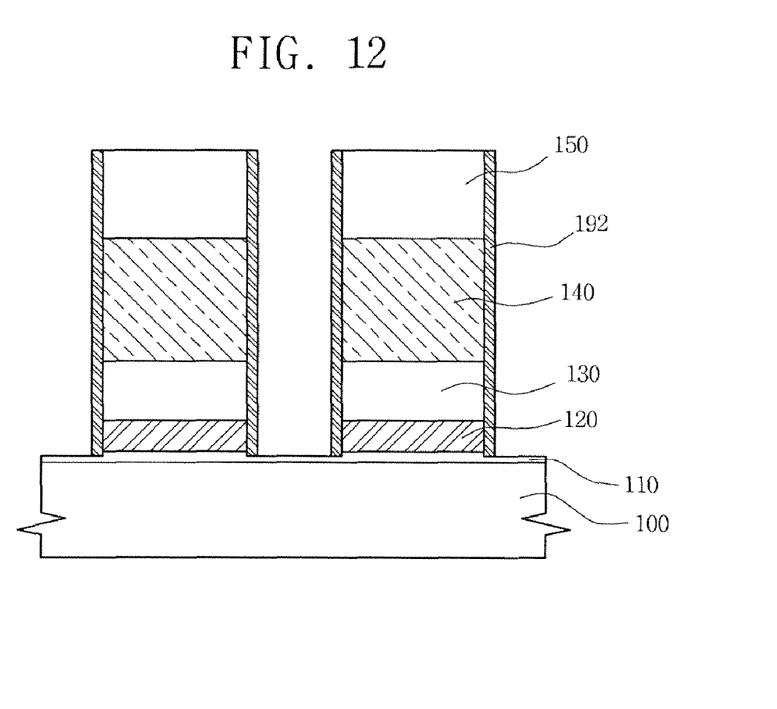

FIGS. 11 and 12 show cross-sectional views for explaining a method of fabricating a non-volatile memory device according to yet another embodiment of the present invention. The same reference numerals in FIGS. 11 and 12 and FIGS. 1 to 6 represent the same components. First, referring to FIG. 11, the method of fabricating a non-volatile memory device according to this embodiment is different from the above-described embodiments in that an etching process using a mask layer pattern 150 as an etching mask is performed to remove a tunneling layer 110 by at least 50% of the total thickness of the tunneling layer. Then, an insulating layer is formed on the entire surface (not shown) of the resultant structure shown in FIG. 11. Then, anisotropic etching is performed on the insulating layer, thereby forming a blocking layer 192 on a partial upper sidewall of the tunneling layer 110, a sidewall of the charge trapping layer 120, a sidewall of the blocking layer 130, a sidewall of the control gate electrode 140 and a sidewall of the mask layer pattern 150, as shown in FIG. 12.

Figure 13:
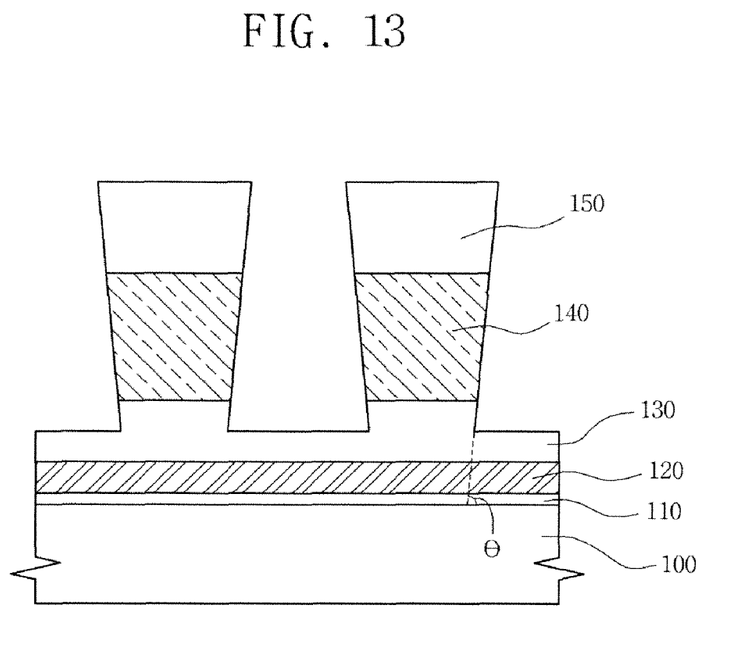
FIGS. 13 and 14 show cross-sectional views for explaining a method of fabricating a non-volatile memory device according to yet another embodiment of the present invention.
Figure 14:
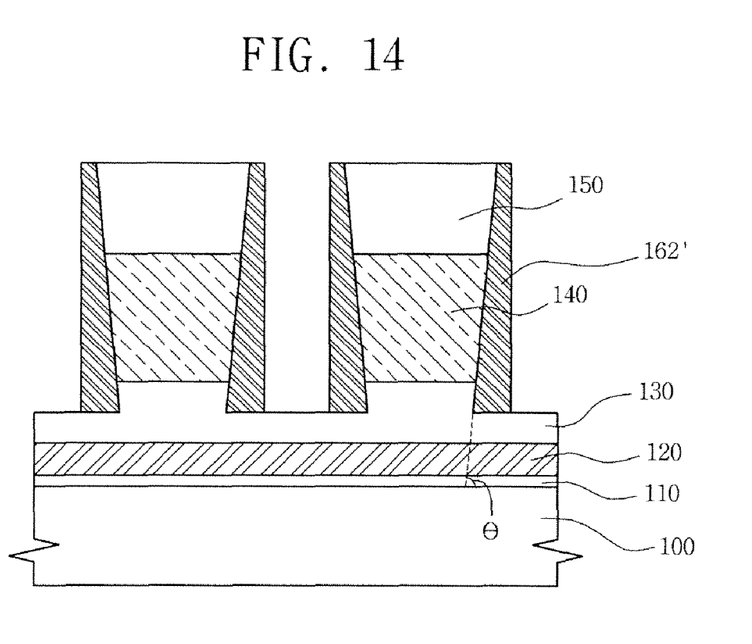

FIGS. 13 and 14 show cross-sectional views for explaining a method of fabricating a non-volatile memory device according to yet another embodiment of the present invention. The same reference numerals in FIGS. 13 and 14 and FIGS. 1 to 6 represent the same components. First, as explained referring to FIG. 2, excessive etching is performed on a control gate electrode 140 using a mask layer pattern 150 as an etching mask to remove an exposed portion of the control gate electrode 140 and also remove an upper portion of the blocking layer 130 by a specified thickness. In this case, as shown in FIG. 13, the etching is performed such that an inclination of exposed sidewalls of the blocking layer 130 and the control gate electrode 140, i.e., an angle θ between the exposed sidewalls of the blocking layer 130 and the control gate electrode 140 and a surface of a substrate 100 is smaller than 90°. That is, the exposed sidewalls of the blocking layer 130 and the control gate electrode 140 have a negative inclination. Accordingly, as shown in FIG. 14, when anisotropic etching for forming a blocking layer 162' is performed, loss of the blocking layer is suppressed, thereby forming the blocking layer 162' having a sufficient thickness.

Figure 15:
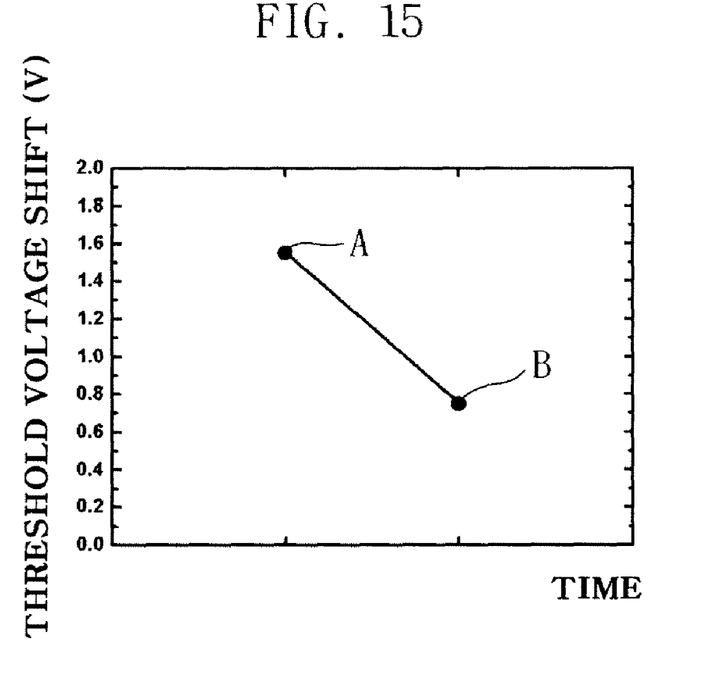
FIG. 15 shows a graph for comparing retention characteristics in a structure formed by a method of fabricating a non-volatile memory device according to an embodiment of the present invention and a structure formed by a conventional method.

FIG. 15 shows a graph for comparing retention characteristics in the structure formed by the method of fabricating a non-volatile memory device according to the present invention and the structure formed by a conventional method. Referring to FIG. 15, when the blocking layer 162 is formed and the NH₃ treatment is performed as a process for curing etching damage as in the present invention, a threshold voltage shift (see "B" in the drawing) is smaller than that (see "A" in the drawing) in a conventional case. Accordingly, it can be seen that charge leakage is small and the retention characteristics are improved.

Figure 16:
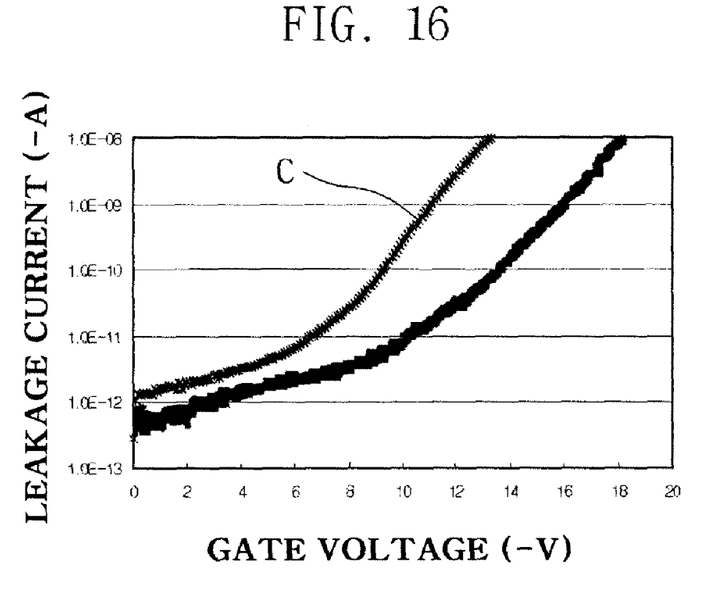
FIG. 16 shows a graph for comparing leakage current characteristics in a structure formed by a method of fabricating a non-volatile memory device according to and embodiment of the present invention and a structure formed by a conventional method.

FIG. 16 shows a graph for comparing leakage current characteristics in the structure formed by the method of fabricating a non-volatile memory device according to the present invention and the structure formed by a conventional method. Referring to FIG. 16, when the blocking layer 162 is formed and the NH₃ treatment is performed as a process for curing etching damage as in the present invention, a leakage current amount (see "D" in the drawing) which is generated by applying a gate voltage is smaller than that (see "C" in the drawing) in a conventional case. Accordingly, it can be seen that the retention characteristics are improved.

According to the present invention, after a partial sidewall of the blocking layer is also exposed in etching of the control gate electrode, a blocking layer is formed on the sidewall of the blocking layer. Accordingly, although a conductive polymer is attached to a sidewall of the charge trapping layer in the following etching of the blocking layer, the conductive polymer and the control gate electrode are electrically separated by the blocking layer. Thus, the present invention has an effect of suppressing charge leakage from the charge trapping layer to the control gate electrode. Further, the process for curing etching damage is subsequently performed to suppress formation of undesirable trap sites by curing the etching damage on an exposed portion of the charge trapping layer in etching. Thus, the present invention has an effect of preventing deterioration of threshold voltage distribution characteristics and retaining characteristics of the device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a non-volatile memory device having a charge trapping layer comprising:
    forming a tunneling layer, a charge trapping layer, a blocking layer, and a control gate electrode layer over a substrate, wherein the blocking layer is a first insulating layer;
    performing a first etching process using a mask layer pattern as an etching mask to remove the control gate electrode layer exposed by the mask layer pattern and to remove the blocking layer disposed between adjacent elements of the mask pattern layer by a specified thickness such that a portion of the blocking layer remains disposed between adjacent elements of the mask pattern layer;
    forming a second insulating layer on sidewalls of the control gate electrode layer and sidewalls of the blocking layer exposed by the first etching process; and
    performing a second etching process using the mask layer pattern and the second insulating layer as an etching mask to remove an exposed portion of the blocking layer disposed between each of the adjacent elements of the mask pattern layer, wherein the second etching process is processed as excessive etching to remove at least 50% of the total thickness of the charge trapping layer; and
    performing a process for curing etching damage on a sidewall of the blocking layer and a sidewall of an exposed portion of the charge trapping layer which are exposed by the excessive etching on the blocking layer.

2. The method according to claim 1, wherein the charge trapping layer includes at least one of a nitride layer, a stoichiometric nitride layer and a silicon-rich nitride layer.

3. The method according to claim 2, wherein the charge trapping layer comprises a silicon-rich nitride layer in which a ratio of silicon (Si) to nitrogen (N) is in a range of 0.85:1 to 10:1.

4. The method according to claim 1, wherein the blocking layer comprises an oxide layer, an alumina ($Al_2O_3$) layer, a hafnium oxide ($HfO_2$) layer, a hafnium aluminum oxide (HfAlO) layer or a zirconium oxide ($ZrO_2$) layer.

5. The method according to claim 1, wherein the specified thickness of the blocking layer removed by the first etching process is in a range of 20% to 50% of the total thickness of the blocking layer.

6. The method according to claim 1, comprising performing the first etching process such that an inclination angle between exposed sidewalls of the control gate electrode layer and the blocking layer and a surface of the substrate is smaller than 90°.

7. The method according to claim 1, comprising forming the second insulating layer on sidewalls of the control gate electrode layer and sidewalls of the blocking layer exposed by the first etching process by a method comprising: forming the second insulating layer over an entire surface of a resultant structure formed by the first etching process; and performing anisotropic etching over the second insulating layer such that the insulating layer remains on exposed sidewalls of the control gate electrode layer and the blocking layer.

8. The method according to claim 1, wherein the second insulating layer comprises a nitride layer, an oxide layer formed by an atomic layer deposition method or a low pressure chemical vapor deposition method, an oxide layer formed by a plasma enhanced chemical vapor deposition method, an oxynitride layer, or a high-k dielectric layer.

9. The method according to claim 1, comprising forming the second insulating layer to have a thickness in a range of 20 A° to 100 A°.

10. The method according to claim 1, wherein the process for curing etching damage comprises NH3 treatment, N2 treatment, O2 treatment, or selective oxidation treatment.

11. The method according to claim 10, wherein the process for curing etching damage comprises $NH_3$ treatment, and further comprising performing rapid thermal treatment or heat treatment in a furnace to remove hydrogen after the $NH_3$ treatment is performed.

12. A method of fabricating a non-volatile memory device having a charge trapping layer comprising:
    forming a tunneling layer, a charge trapping layer, a blocking layer and a control gate electrode layer over a substrate, wherein the blocking layer is a first insulating layer;
    performing a first etching process using a mask layer pattern as an etching mask to remove the control gate electrode layer exposed by the mask layer pattern and to remove the blocking layer disposed between adjacent elements of the mask layer pattern by a specified thickness such that a portion of the blocking layer remains disposed between adjacent elements of the mask layer pattern;
    forming a second insulating layer on sidewalls of the control gate electrode layer and sidewalls of the blocking layer exposed by the first etching process; and
    performing a second etching process using the mask layer pattern and the second insulating layer as an etching mask to remove an exposed portion of the blocking layer disposed between each of the adjacent elements of the mask layer pattern, wherein the second etching process is performed as excessive etching to remove the charge trapping layer by a specified thickness; and
    performing a process for curing etching damage to form an etching damage cured layer on a sidewall of the blocking layer and a sidewall of an exposed portion of the charge trapping layer which are exposed by the second etching process.

13. The method according to claim 12, wherein forming the second insulating layer on sidewalls of the control gate electrode layer and sidewalls of the blocking layer exposed by the first etching process includes:
    forming the second insulating layer over an entire surface of a resultant structure formed by the first etching process; and
    performing anisotropic etching on the second insulating layer such that the second insulating layer remains on exposed sidewalls of the control gate electrode layer and exposed sidewalls of the blocking layer.

14. The method according to claim 12, wherein the second insulating layer includes a nitride layer, an oxide layer formed by an atomic layer deposition method or a low pressure chemical vapor deposition method, an oxide layer formed by a plasma enhanced chemical vapor deposition method, an oxynitride layer, or a high-k dielectric layer.

15. The method according to claim 12, comprising forming the second insulating layer to have a thickness in a range of 20 A to 100 A.

16. The method according to claim 12, comprising performing the second etching process to remove at least 50% of the total thickness of the charge trapping layer.

17. The method according to claim 12, wherein the process for curing etching damage comprises $NH_3$ treatment, $N_2$ treatment, $O_2$ treatment, or selective oxidation treatment.

18. The method according to claim 17, wherein the process for curing etching damage comprises $NH_3$ treatment, and further comprising performing rapid thermal treatment or heat treatment in a furnace to remove hydrogen after the $NH_3$ treatment is performed.

* * * * *